(12) United States Patent
Katayama et al.

(10) Patent No.: US 7,688,164 B2
(45) Date of Patent: Mar. 30, 2010

(54) HIGH FREQUENCY CIRCUIT BOARD CONVERTING A TRANSMISSION MODE OF HIGH FREQUENCY SIGNALS

(75) Inventors: Tetsuya Katayama, Aichi-ken (JP); Hisanori Uda, Nagoya (JP)

(73) Assignee: Denso Corporation, Kariya (JP)

( * ) Notice: Subject to any disclaimer, the term of this patent is extended or adjusted under 35 U.S.C. 154(b) by 281 days.

(21) Appl. No.: 11/904,588

(22) Filed: Sep. 27, 2007

(65) Prior Publication Data
US 2008/0211604 A1 Sep. 4, 2008

(30) Foreign Application Priority Data
Sep. 28, 2006 (JP) .............................. 2006-264806

(51) Int. Cl.
*H01P 1/16* (2006.01)
*H01P 1/00* (2006.01)

(52) U.S. Cl. ........................................ 333/260; 333/246
(58) Field of Classification Search ................. 333/238, 333/246, 21 R, 254, 260, 33
See application file for complete search history.

(56) References Cited

U.S. PATENT DOCUMENTS 4,906,953 A 3/1990 Li et al.
6,501,352 B1 * 12/2002 Koriyama et al. ........... 333/260

FOREIGN PATENT DOCUMENTS

| JP | 01-005102 | 1/1989 |
|---|---|---|
| JP | 2001-094012 | 4/2001 |
| JP | 2001-102820 | 4/2001 |
| JP | 2001-345607 | 12/2001 |

OTHER PUBLICATIONS

Office action dated Jun. 2, 2009 in corresponding German Application No. 10 2007 046 351.2.
L. Zhu at al, "A Broadband CPW-to-Microstrip Via-less Transition for on Wafer Package Probing Applications", 2003 Electrical Performance of Electronic Packaging, IEEE, Oct. 2003, pp. 75-78.
Office action dated Dec. 8, 2009 in corresponding Japanese Application No. 2006-264806.

* cited by examiner

*Primary Examiner*—Stephen E Jones
(74) *Attorney, Agent, or Firm*—Harness, Dickey & Pierce, PLC

(57) ABSTRACT

A microstrip line includes a signal strip conductor and a ground conductor. A coplanar line includes two regions. A first region includes a signal strip conductor which is connected to the signal strip conductor of the microstrip line via a wire or the like and a ground strip conductor which continues to the ground conductor. A second region is formed with a ground strip conductor formed above the ground strip conductor via a through hole. A transmission mode changes itself in the microstrip line, the first region of the coplanar line, and the second region of the coplanar line in the sequence as described. This enables converting the transmission mode efficiently from the microstrip line to the coplanar line.

12 Claims, 8 Drawing Sheets

|←— A —→|←—— B ——→|
MICROSTRIP LINE  COPLANAR LINE

|←— A —→|←—— B ——→|
MICROSTRIP LINE  GROUND-TYPE
COPLANAR LINE

HIGH FREQUENCY CIRCUIT BOARD CONVERTING A TRANSMISSION MODE OF HIGH FREQUENCY SIGNALS

CROSS-REFERENCE TO RELATED APPLICATION

This application is based on and claims the benefit of priority from the earlier Japanese Patent Application NO. 2006-264806 filed Sep. 28, 2006 the description of which is incorporated herein by reference.

BACKGROUND OF THE INVENTION

1. Field of the Invention

The present invention relates to a high frequency circuit board which includes a microstrip line and a coplanar line. Further, the present invention relates to a high frequency circuit board which enables transmission of signals with little loss and reflection to semiconductor device by carrying out conversion of a transmission mode from the microstrip line to the coplanar line efficiently and with low loss.

2. Description of the Related Art

Conventionally, a high frequency circuit board using a conversion of a transmission mode from a microstrip line to a coplanar line as disclosed in Japanese Patent Laid-open Publication No. S64-5102, No. 2001-94012, and No. 2001-102820.

In the Japanese Patent Laid-open Publication No. S64-5102, the configuration as shown in FIG. 9 and FIG. 10 is disclosed as a conventional example. A representative method of an imaginary grounding is shown in FIG. 9. Conversion of a transmission mode between the microstrip line and the coplanar line is realized by making a connecting point between the coplanar line and the microstrip line the imaginary ground using an open stub with $\lambda/4$ ($\lambda$: the wavelength of high frequency signal). FIG. 10 shows another example of conversion, in which conversion of a transmission mode between the microstrip line and the coplanar line is realized by connecting a ground line end portion of the coplanar line on the front side of the circuit board and a circuit board ground conductor on the reverse side of the circuit board using a through hole on the side closer to the coplanar line circuit board.

In the case where a semiconductor device is mounted on a circuit board formed with the coplanar line, combination of the methods as shown in FIG. 9 and FIG. 10 is conceivable. Specifically, in a connecting region of the microstrip line, a ground line with one end thereof open is arranged on both sides of the line. Next, the other end of the ground line is connected to the ground line of the semiconductor device with a gold wire. Next, an imaginary ground can be realized by making the distance between the connecting point and the open end of the ground line as $\lambda/4$ or $3\lambda/4$. As a result of this, mode conversion is enabled. Similarly, imaginary grounding can also be realized at the connecting point by grounding an open end 72 of the ground line to the ground surface on the reverse side, and making the distance between an end point 70 thereof and a connecting point 71 as above mentioned $\lambda/2$, as shown in FIG. 11. Accordingly, conversion for both modes is enabled. As described above, the configuration shown in FIG. 11 can be readily imagined from FIG. 9 and FIG. 10.

In the Japanese Patent Laid-open Publication No. 2001-94012, an example of conversion of a transmission mode from the microstrip line to the coplanar line using a fan-shaped ground pattern of the imaginary ground is indicated. The third embodiment and FIG. 9 in the Japanese Patent Laid-open Publication No. 2001-102820 indicate conversion of a transmission mode between the coplanar line and the microstrip line. In addition, the first embodiment and FIG. 3A to FIG. 3D thereof provide a way of preventing increase in preventing in increase reflection due to impedance fluctuation caused by the gold wire. Specifically, an inductor made of a line with a large width and a capacitor made of a line with a small width are formed at the connecting portion, and these elements and an inductor made of gold wire configure a filter. It is described that this enables matching impedance between the lines to be connected.

The conversion methods of the transmission mode in the Japanese Patent Laid-open Publication No. 2001-94012 and in the third embodiment of Japanese Patent Laid-open Publication No. 2001-102820 as shown in FIG. 9 are to form a slit which makes the width of the ground line smaller, and to realize the imaginary ground at the position of the slit. In addition, ingenuity is used for facilitating favorable impedance matching and conversion by configuring a capacitor such that the slit has a larger width in some regions of a signal line so as to decrease the gap from the ground line. However, since the gap between the signal line of the coplanar line and the ground line is only approx. 20 μm even at the narrowest portion, it is very difficult to create it in the case where an organic substrate is used. On the other hand, if the gap at this portion increases, the transmission mode for the coplanar line will not be dominant. Specifically, in the case where an organic substrate is used to decrease the manufacturing cost, the gap which can be created increases. As a result of this, according to the conversion method as described in the Japanese Patent Laid-open Publication No. 2001-94012 and Japanese Patent Laid-open Publication No. 2001-102820, conversion of a transmission mode cannot be performed efficiently, and it is difficult to connect the wire to the line of the semiconductor while the transmission mode for the coplanar line remains unchanged.

In addition, in the configuration shown in FIG. 11 as above described which is conceivable from the conventional example described in the Japanese Patent Laid-open Publication No. S64-5102, conversion of a transmission mode from the microstrip line to the coplanar line occurs rapidly, and thereby increasing a loss. Furthermore, since the necessary distance from the short-circuit end 70 with respect to the ground surface on the reverse side to the line of the semiconductor device as well as to the connecting point 71 of the wire is $\lambda/2$, the line will become longer.

SUMMARY OF THE INVENTION

Accordingly, an object of the present invention is to realize conversion of a transmission mode from a microstrip line to a coplanar line efficiently and with low loss.

This enables realizing a high frequency circuit board which is capable of inputting and outputting signals to a semiconductor device with low loss and low reflection loss.

The first aspect of the present invention is a high frequency circuit board comprising a microstrip line including a dielectric region, a ground conductor which is formed in a planner shape on a bottom surface of the dielectric region, a first signal strip conductor which is linear shaped and formed on a top surface of the dielectric region; and a coplanar line connected to the microstrip line for mounting a semiconductor device connected to the coplanar line, the coplanar line including: the dielectric region, a second signal strip conductor which is linear shaped and formed on a top surface of the dielectric region and connected to the first signal strip conductor, a pair of first ground strip conductors which are formed on the bottom surface of the dielectric region and not below the second signal strip conductor, and which are formed in regions that correspond to both sides of the second signal strip conductor in such a manner that they continue from the ground conductor, and a second ground strip conductor which is formed on each side of the second signal strip conductor on the top surface of the dielectric region and is connected to an end portion of the pair of the first ground strip conductors on the bottom surface.

Connection between the microstrip line and the coplanar line according to the first aspect of the present invention includes three configurations: the microstrip line; a coplanar line portion which includes the second signal strip conductor and the first ground strip conductor (hereinafter referred to as a first coplanar line portion), and a coplanar line portion which includes the second signal strip conductor and the first and second ground strip conductors (hereinafter referred to as a second coplanar line portion) and the three configurations are connected in the sequence described above.

The first ground strip conductor of the first coplanar line portion continues from the ground conductor, and therefore is within the same plane as the ground conductor. Accordingly, it is also possible to consider the configuration of the first coplanar line portion as a microstrip line in which a ground conductor is not formed below the signal strip conductor. Hence, the transmission mode for the first coplanar line portion is like a transmission mode of a quality between the transmission mode for the microstrip line and the transmission mode for the coplanar line.

The transmission mode coverts in three stages: the microstrip line, the first coplanar line portion, and the second coplanar line portion, which enables efficient conversion of a transmission mode from the microstrip line to the coplanar line with low loss, without any sharp change in the transmission mode from the microstrip line to the coplanar line.

The first signal strip conductor and the second signal strip conductor may be connected to each other with a wire or the like to match impedance. If impedance is matched, the first signal strip conductor and the second signal strip conductor may have a continued configuration. In addition, since the first aspect of the present invention realizes conversion of a transmission mode with a two-layer configuration as described above, it is possible to increase a gap between the signal line and the ground line to, for example, approx. 100 μm. Hence, an organic substrate with a reduced production cost can be used as a circuit board.

The second aspect of the present invention is high frequency circuit board according to the first aspect of the present invention, the second ground strip conductor is connected to a ground layer of the semiconductor device via a wire, and line lengths of the first ground strip conductor and the second ground strip conductor the line are set such that a connecting point between the wire and the ground layer is short circuited at a certain frequency.

Connection of the coplanar line and the semiconductor device as described above enables imaginary grounding of the ground of the semiconductor device and stabilizing the ground at a desired frequency. Particularly, in the case where the semiconductor device includes a ground layer on a surface or in the vicinity of a surface, as in the third aspect of the present invention, occurrence of a parallel plate mode can be suppressed. The parallel plate mode refers to a transmission mode for transmitting signals between the ground layer of a semiconductor chip and a ground of the circuit board below the semiconductor chip.

The fourth aspect of the present invention is a high frequency circuit board according to the second aspect of the present invention or the third aspect of the present invention, the first ground strip conductor has a shape such that a width of the conductor gradually decreases as the first ground strip conductor travels in the direction toward the semiconductor device.

The fifth aspect of the present invention is a high frequency circuit board in which the second ground strip conductor has a shape such that a width of the conductor gradually increases as the second ground strip conductor travels in the direction toward the semiconductor device.

The shape in which the width of the conductor gradually decreases or increases may be a shape in which the width of the conductor of each of the entire first and second ground strip conductors gradually decreases or increases, or may be a shape in which only an end portion gradually decreases or increases and other portions have a constant conductor width.

The shape with gradually decreased or increased width of the conductor generates an evanescent wave which serves as capacitance, which causes phase rotation to increase. In addition, the shape of the second ground strip conductor causes current to converge to the wire at once, thereby generating an evanescent wave. The evanescent wave serves as an inductor, which causes phase rotation to increase. The effect of the two phase rotations as described above enables shortening the line length of the coplanar line. Particularly, as in the sixth aspect of the present invention, the shape with gradually decreased or increased width of the conductor is a fan shape at least at an end portion region is capable of further increasing capacitance and inductor caused by the evanescent wave, enabling further shortening the line length.

The seventh aspect of the present invention is a high frequency circuit board according to the first aspect of the present invention to the sixth aspect of the present invention, the semiconductor device is a millimeter-wave semiconductor device.

In the first aspect of the present invention, the dielectric region is interposed between the second signal strip conductor and the first ground strip conductor. In addition, the first aspect of the present invention realizes a transmission mode which is a transmission mode of a quality between the transmission mode for the microstrip line and the transmission mode for the coplanar line by having a two-layered structure, and converts the transmission mode from the microstrip line to the coplanar line in a phased manner. Accordingly, the first aspect of the present invention enables conversion of a transmission mode with low loss. Furthermore, as in the second and third aspects of the present invention, when the coplanar line and the semiconductor device are connected to each other, the ground closer to the semiconductor device can be made imaginary ground, which enables suppressing generation of the parallel plate mode. The second and third aspects of the present invention also enable enhancing isolation between other ports. In addition, as in the fourth, fifth and sixth aspects of the present invention, use of a shape with gradually decreased or increased width of the conductor enables shortening the length of conversion from the microstrip line to the coplanar line, thereby enabling minituraization. In addition, the high frequency circuit board according to the present invention, as in the seventh aspect of the present invention, can also be used in a millimeter waveband. Moreover, the present invention does not require microfabrication and enables increasing the gap between the signal line and the ground line to, for example, approx. 100 μm, which enables use of an organic substrate thereby enabling reducing the cost.

DESCRIPTION OF THE PREFERRED EMBODIMENTS

Exemplary embodiments of the present invention are below described in detail with reference to the attached drawings. However, the present invention is not limited in anyway to those embodiments.

First Embodiment

First, a configuration of a high frequency circuit board according to the present invention will be described.

Figure 1:
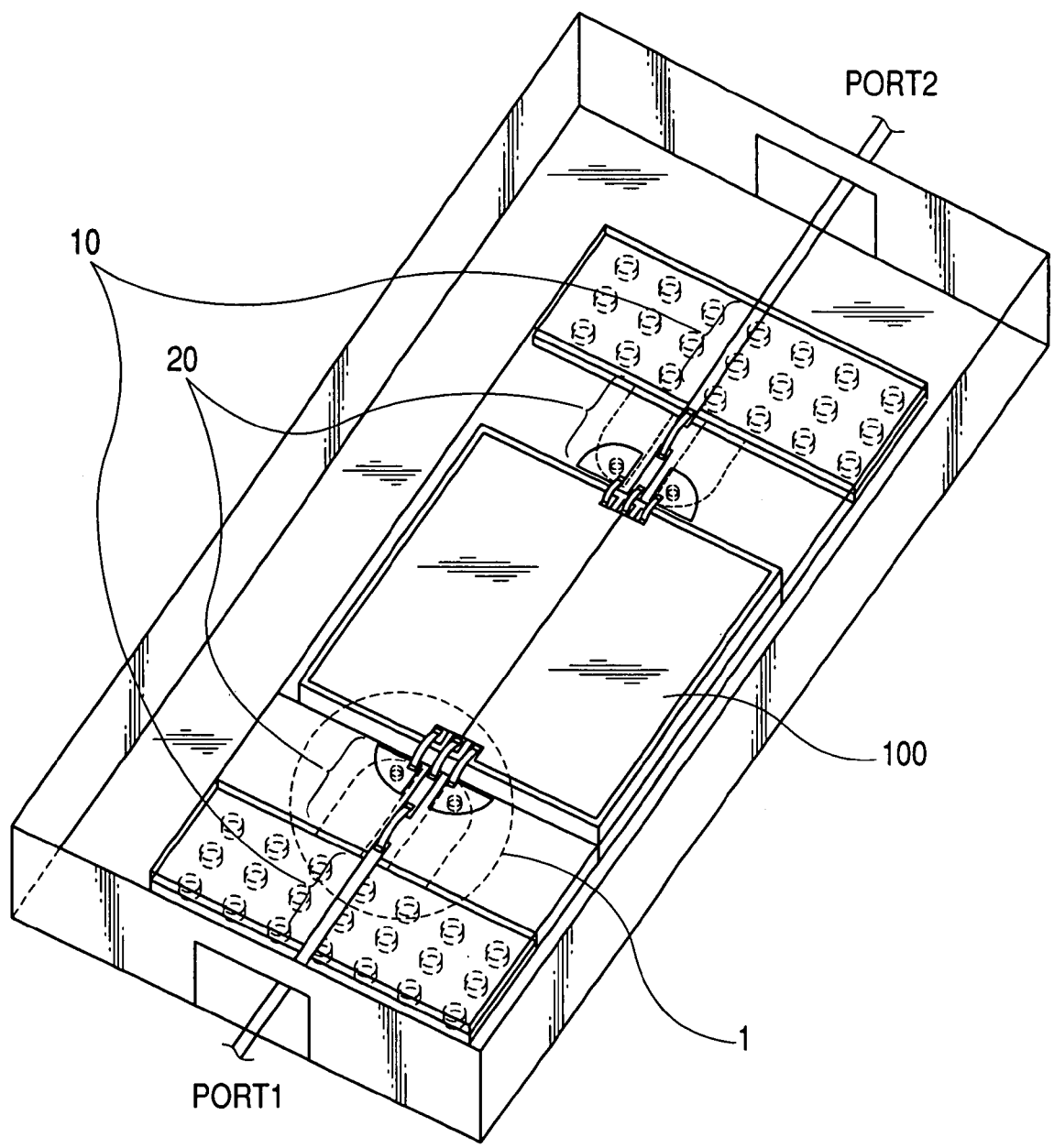
FIG. 1 is an overhead view of a high frequency circuit board according to a First Embodiment.

FIG. 1 is a view of high frequency circuit board according to the present invention seen from diagonally above. The high frequency circuit board includes a microstrip line 10, a coplanar line 20, and ports 1, 2, and is symmetrically configured laterally and vertically. The high frequency circuit board is also mounted with a chip 100. In this case, because of ease of simulation, in place of a semiconductor device, a dummy chip 100 formed with a microstrip line 105 is used.

Figure 2:
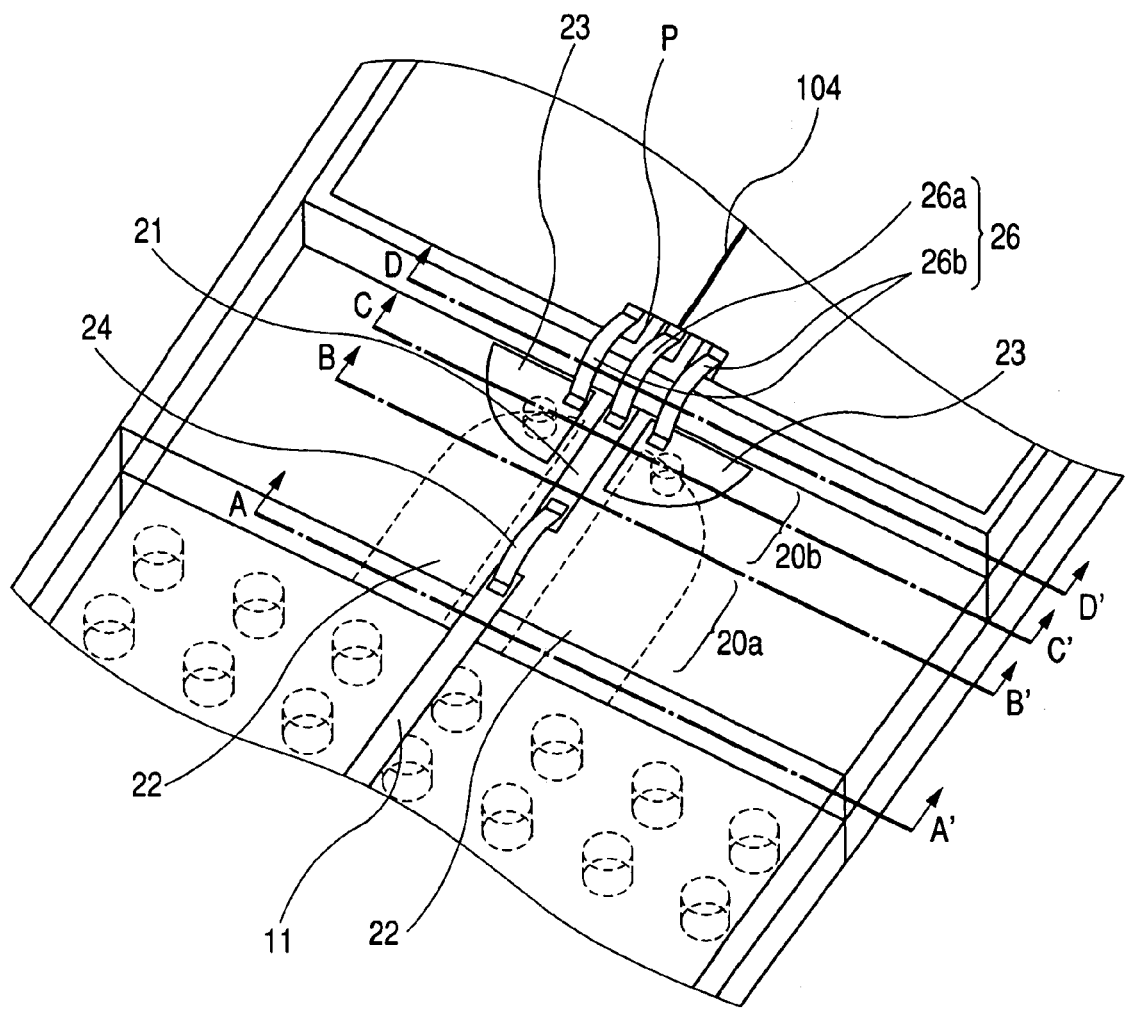
FIG. 2 is an expanded view of a major portion of the First Embodiment.
Figure 3A:
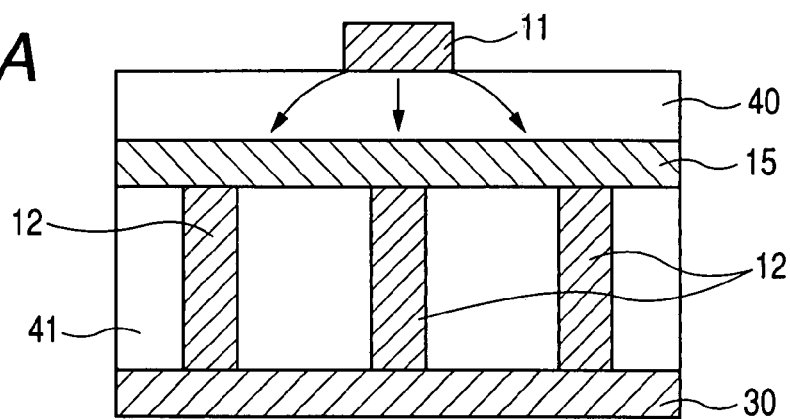
FIG. 3A to FIG. 3D is a sectional view of individual portions in FIG. 2.

FIG. 2 is an expanded view of a major portion 1 of the present invention, and FIG. 3A to FIG. 3D shows sections cut along A-A', B-B', C-C' and D-D', respectively. In FIG. 3A to FIG. 3D, arrows show a direction of the electric field when signals are transmitted. The configuration of the circuit board according to the present invention will be described in more details referring to FIG. 2 and FIG. 3A to FIG. 3D. First, referring to FIG. 3A showing a cross section cut along A-A', the configuration of the microstrip line 10 will be described. In the microstrip line 10, a ground conductor 15 is formed on a grounded metal plate 30 with a dielectric region 41 interposed therebetween, and the grounded metal plate 30 and the ground conductor 15 are connected to each other via through holes 12. In addition, a dielectric region 40 (corresponding to a dielectric region in the present invention) is formed on the ground conductor 15, on which a signal strip conductor 11 (corresponding to a first signal strip conductor of the present invention) is further formed. Note that the dielectric regions 40, 41 are configured by a same dielectric body. They may be integrated to one piece, or alternatively, may be formed by joining separate bodies.

Figure 3B:
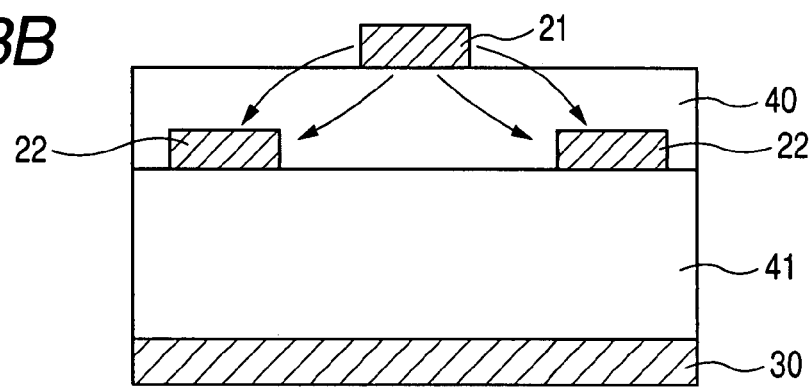
Figure 3C:
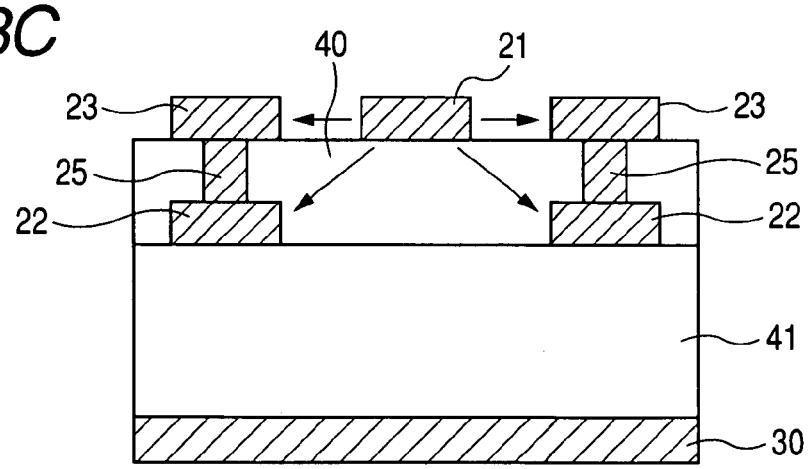

Next, the configuration of the coplanar line 20 will be described with reference to FIG. 2, FIG. 3B showing a cross section along B-B', and FIG. 3C showing a cross section along C-C'. In the coplanar line 20, ground strip conductors 22 (corresponding to first ground strip conductors of the present invention) which continue from the ground conductor 15 are formed on the dielectric region 41, and a signal strip conductor 21 (corresponding to a second signal strip conductor of the present invention) is formed on the dielectric region 40. The ground conductor 15 and the ground strip conductors 22 are in the same plane. The pair of the ground strip conductors 22 are disposed in such a manner as to sandwich the signal strip conductor 21, and the distance between the left and right ground strip conductors 22 is constant. The signal strip conductor 11 and the signal strip conductor 21 are connected to each other via a wire 24. The purpose of this connection is to match impedance between the lines. If there is no need to match impedance, the signal strip conductor 11 and the signal strip conductor 21 may be integrated to one piece.

In a region 20a of the coplanar line 20 closer to the microstrip line 10, the ground strip conductor 22 has a constant conductor width. On the other hand, in a region 20b of the coplanar line 20 closer to the chip 100, as shown in FIG. 2, the ground strip conductor 22 has a shape in which the line width decreases in the direction toward the chip and has a fan shape at the end portion thereof. In the region 20b, as shown in FIG. 3C, a pair of ground strip conductors 23 (corresponding to second ground strip conductors of the present invention) are formed on the ground strip conductor 22 as well as on the dielectric region 40 in such a manner as to sandwich the signal strip conductor 21. Furthermore, each of the ground strip conductors 22 and each of the ground strip conductors 23 is connected to each other via a through hole 25. The ground strip conductors 23, as shown in FIG. 2, have a shape in which the line width increases in the direction toward the chip and have a fan shape which is vertically symmetric to the fan shape of the ground strip conductors 22. The signal strip conductor 21 and the ground strip conductors 23 are in the same plane, and the gap there between is constant 100 μm.

Figure 4:
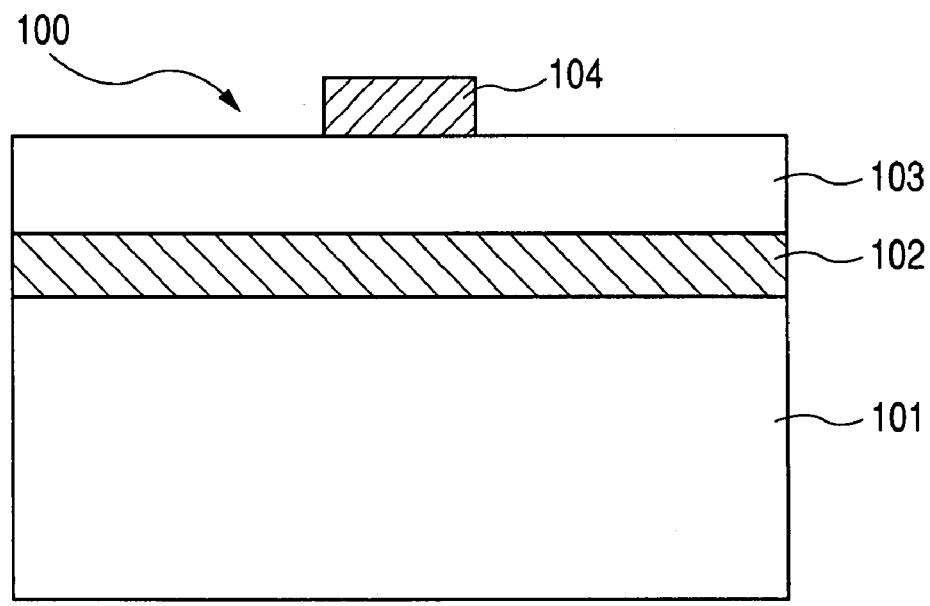
FIG. 4 is a sectional view showing a configuration of a chip.

As shown in the sectional view in FIG. 4, the chip 100 includes a SiC circuit board 101, a chip ground layer 102 thereon, an SiO$_2$ layer 103 thereon, and a signal strip conductor 104 thereon. The microstrip line 105 includes the chip ground layer 102 and the signal strip conductor 104. The chip 100 is mounted on the grounded metal plate 30 as shown in FIG. 1.

Figure 3D:
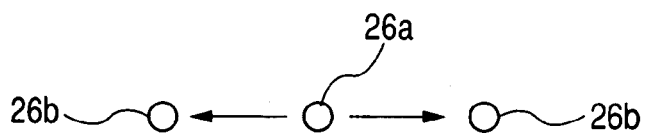

The coplanar line 20 and the chip 100 are connected to each other via a wire 26. FIG. 3D shows a cross section of the wire 26 along D-D'. The signal strip conductor 21 is connected to the signal strip conductor 104 via a wire 26a. The ground strip conductors 23 are connected to the chip ground layer 102 via a wire 26b. To realize this connection, a hole for exposing the chip ground layer 102 is formed in the SiO$_2$ layer.

Line lengths of the ground strip conductors 22 and the ground strip conductors 23 are adjusted so that a connecting portion between the wire 26b and the chip ground layer 102 is in an electrically short-circuited state at a certain frequency. Specifically, the line lengths are set to one fourth of the wavelength in waveguide, or the odd number times thereof. This setting enables imaginary grounding of the side closer to the chip 100. The imaginary ground makes the chip ground layer 102 and the grounded metal plate 30 same electrical potential and makes the parallel plate mode less likely to occur in the vicinity of the connecting portion between the wire 26b and the chip ground layer 102.

It is possible to consider the configuration of the region 20a of the coplanar line 20 according to the First Embodiment as a microstrip line in which the ground strip conductors 22 serve as the ground conductor and there is no ground conductor below the signal strip conductor 21, or as a coplanar line in which the position of the ground strip conductor is lower than the position of the signal strip conductor 21. Due to this configuration, the direction of the electric field when a signal is transmitted in the region 20a is a direction from the signal strip conductor 21 to the ground strip conductors 22 that are diagonally below as shown by the arrows in FIG. 3B. Accordingly, a transmission mode for the region 20a is a transmission mode of a quality between the transmission mode for the microstrip line and the transmission mode for the coplanar line. It is also possible to consider the configuration of the region 20b of the coplanar line 20 as a coplanar line in which the thickness of the ground strip conductor is larger than the thickness of the signal strip conductor 21, if the ground strip conductor 22 and the ground strip conductors 23 are integrated into one piece and considered as a single ground strip conductor. The direction of the electric field in the region 20b when a signal is transmitted, as shown by the arrows in FIG. 3C, is the direction from the signal strip conductor 21 to the ground strip conductors 22, 23. Accordingly, the transmission mode for the region 20b is substantially the same as the transmission mode for the coplanar line.

In addition, the direction of the electric field in the wire 26 is the direction from the wire 26a to the wire 26b as shown by the arrows in FIG. 3D. Hence, the transmission mode for the wire 26 is the same as the transmission mode for the coplanar line.

The transmission mode changes itself to the transmission mode for the microstrip line 10, the transmission mode for the region 20a of the coplanar line 20, the transmission mode for the region 20b of the coplanar line 20, and the transmission mode for the wire 26. The transmission mode for the wire 26 is connected to the chip 100. In this case, as described above, the transmission mode for the region 20a of the coplanar line 20 is a transmission mode of a quality between the transmission mode for the microstrip line and the transmission mode for the coplanar line. Therefore, the transmission mode changes from the transmission mode for the microstrip line to the transmission mode for the coplanar line in a phased manner. Although discontinuity of the transmission mode causes reflection or leakage, such mode change in a phased manner suppresses reflection loss and leakage loss caused by discontinuity.

Figure 5:
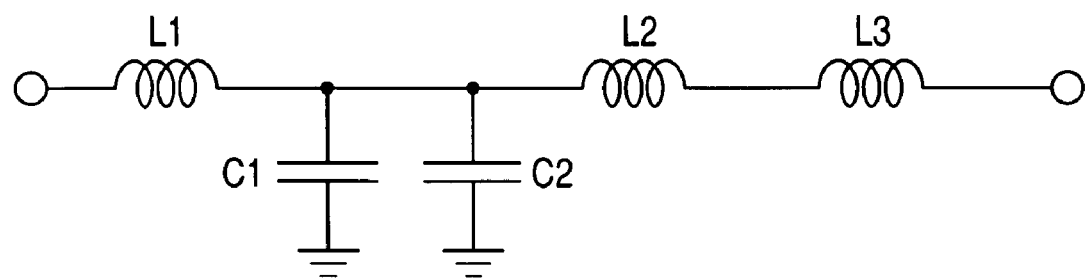
FIG. 5 is an equivalent circuit diagram of a connecting portion between a coplanar line 20 and a chip 100.

FIG. 5 is an equivalent circuit diagram of the connecting portion between the coplanar line 20 and the chip 100. A portion including a capacitance component C1 and an inductance component L1 is equivalent in terms of the lines. A capacitance component C2 and an inductance component L2 are generated due to generation of an evanescent wave, and an inductance component L3 is generated due to the wire 26. Since the ground strip conductor 22 has been integrated with the ground conductor 15, the end of the ground strip conductor 22 closer to the microstrip line 10 is short circuited. In the region 20b of the coplanar line 20, the ground strip conductor 22 has a fan shape. Accordingly, in the vicinity of the interface, an overfilled-launch condition is generated in a direction which is not perpendicular to the traveling direction of a signal and the signals cannot be propagated, and therefore an evanescent wave is generated. In a similar way, an evanescent wave is generated in the fan shape of the ground strip conductors 23. The evanescent wave serves as the capacitance component C2. The fan shape of the ground strip conductor 22 also has an effect of concentrating current into the through hole 25. The ground strip conductors 23 converge current from a wide line to the narrow wire 26b rapidly. Therefore, the inductance component L2 is generated due to the current convergence. The capacitance component C2 and the inductance component L2 enable making a phase rotation of a signal larger. The phase rotation enables shortening the line length of the coplanar line 20 which is necessary for short-circuiting a connecting point p between the wire 26b and the chip ground layer 102. In the high frequency circuit board according to the First Embodiment, the line length of the coplanar line 20 is designed such that the connecting point p is short circuited for a signal at 77 GHz.

If the line length is designed such that the connecting point p is short circuited for the input signal at 77 GHz, the lengths of the ground strip conductors 22 will be 850 µm, and the lengths of the ground strip conductors 23 will be 300 µm. Suppose if a fan shape is not used for the ground strip conductors 23 and instead a merely rectangular shape is used, the required length will be 1050 µm, and therefore the effect of reduction by use of a fan shape is 200 µm. In addition, in the case where a fan shape is not used or the conductor is not multi-stratified, in other words, if there is no ground strip conductor 22, the length of approx. 1050 µm is required for the ground strip conductors 23. However, multi-stratification as in the present invention enables the ground strip conductors 23 to require only 300 µm in length.

Figure 6:
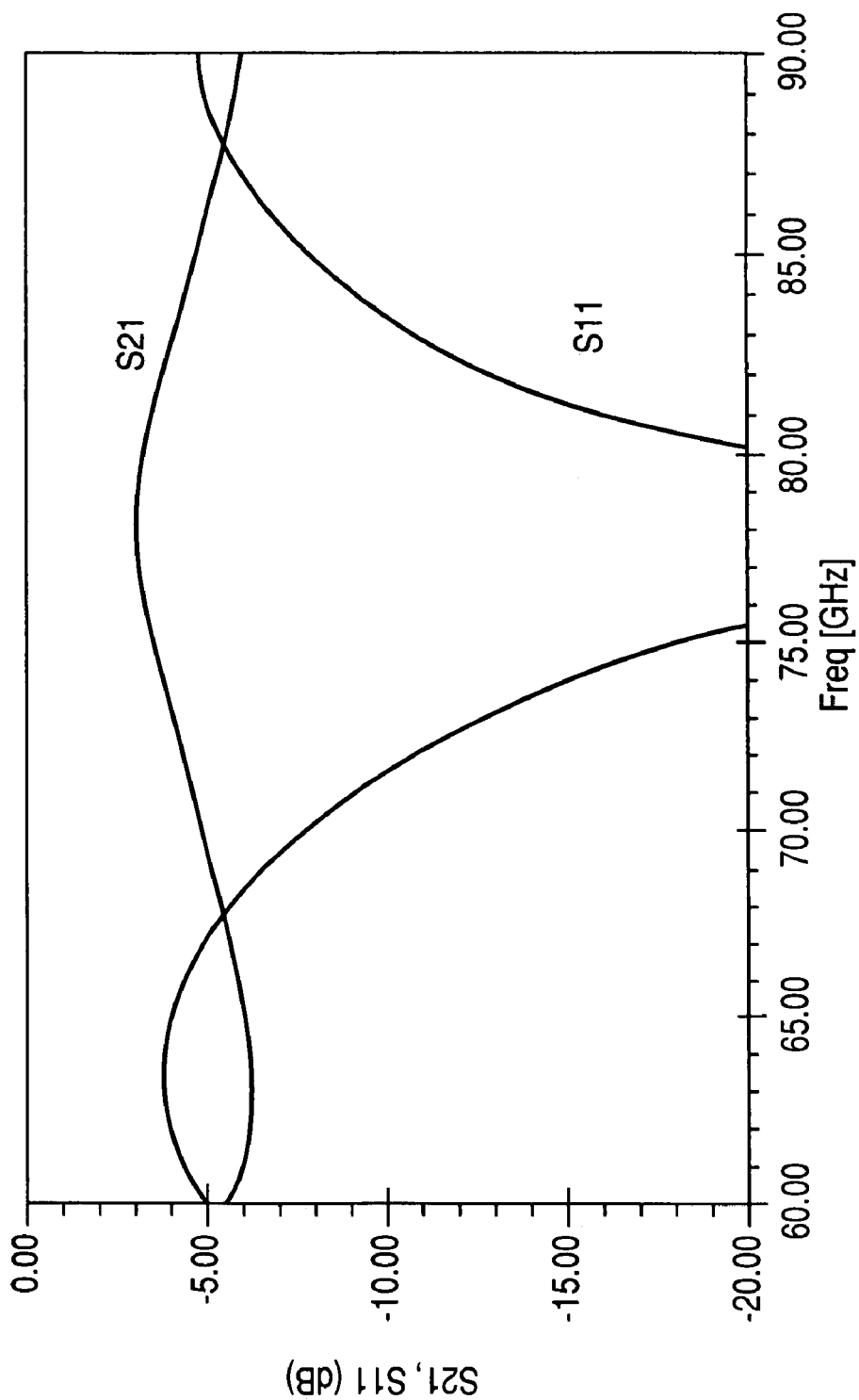
FIG. 6 is a graph showing a result of simulation on reflection characteristics and transmission characteristics of the high frequency circuit board according to the First Embodiment.

FIG. 6 shows a result obtained by simulation on a reflection characteristic S11 and transmission characteristics S21 from a port 1 to a port 2 in the case where the frequency of a signal inputted from the port 1 of the high frequency circuit board according to the First Embodiment is changed. The reflection characteristics S11 is −20 dB or less in a wide bandwidth from 75.5 GHz to 80 GHz, which indicates that the First Embodiment realizes low loss. The transmission characteristic S21 is approx. −3 to −6 dB from 60 GHz to 90 GHz, also showing favorable results.

Second Embodiment

Figure 7:
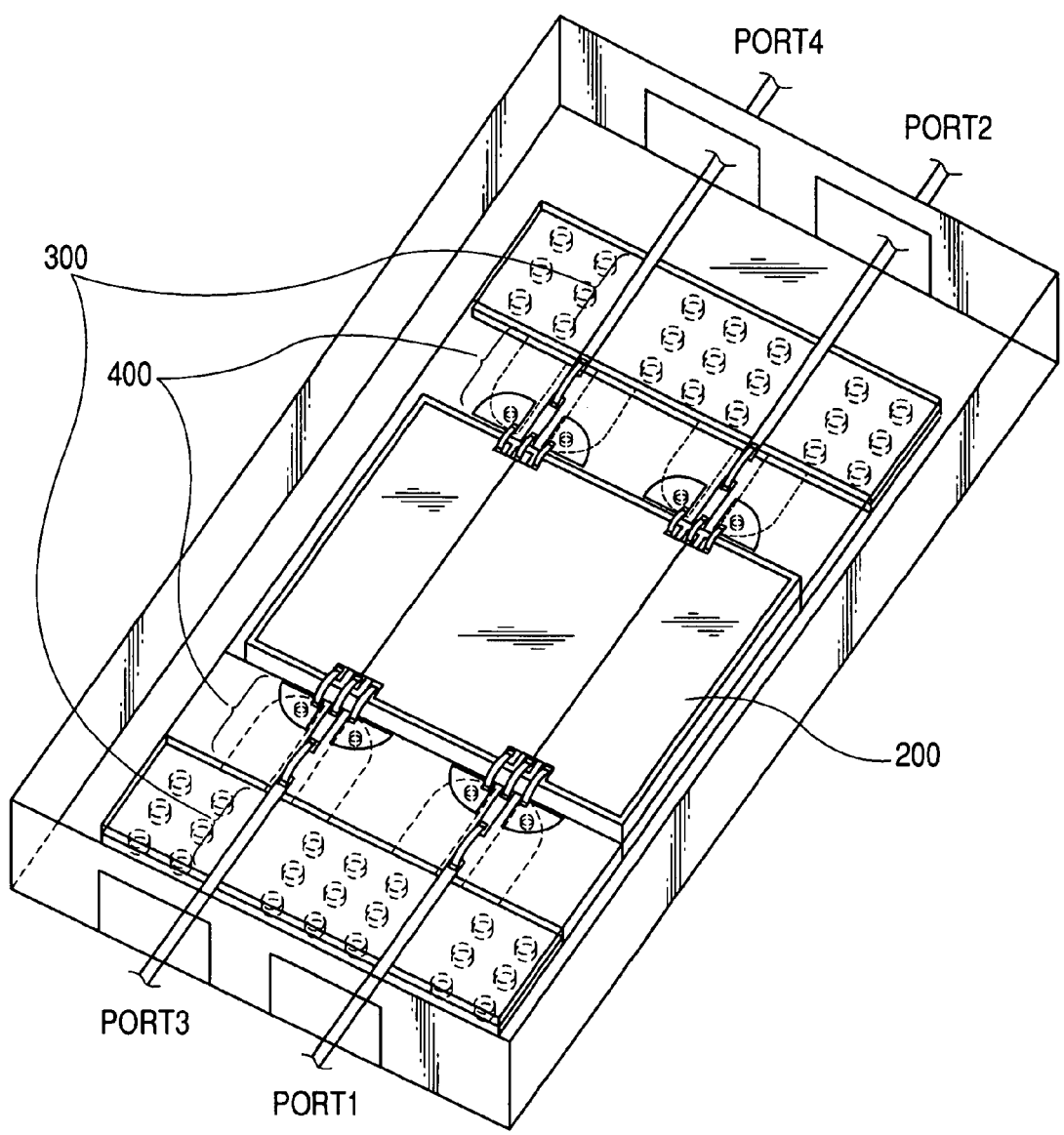
FIG. 7 is an overhead view of a high frequency circuit board according to the Second Embodiment.

FIG. 7 is a view of a high frequency circuit board according to the Second Embodiment seen from diagonally above. The high frequency circuit board includes a microstrip line 300 and a coplanar line 400 that have the same configurations as the First Embodiment, and ports 1 to 4, and is symmetrically configured laterally and vertically. The high frequency circuit board is also mounted with a chip 200. The chip 200 is formed with two microstrip lines which are configured to connect the port 1 to the port 2, and the port 3 to the port 4, respectively. The chip 200 has the same configuration as the chip 100 except that there are two microstrip lines.

Figure 8:
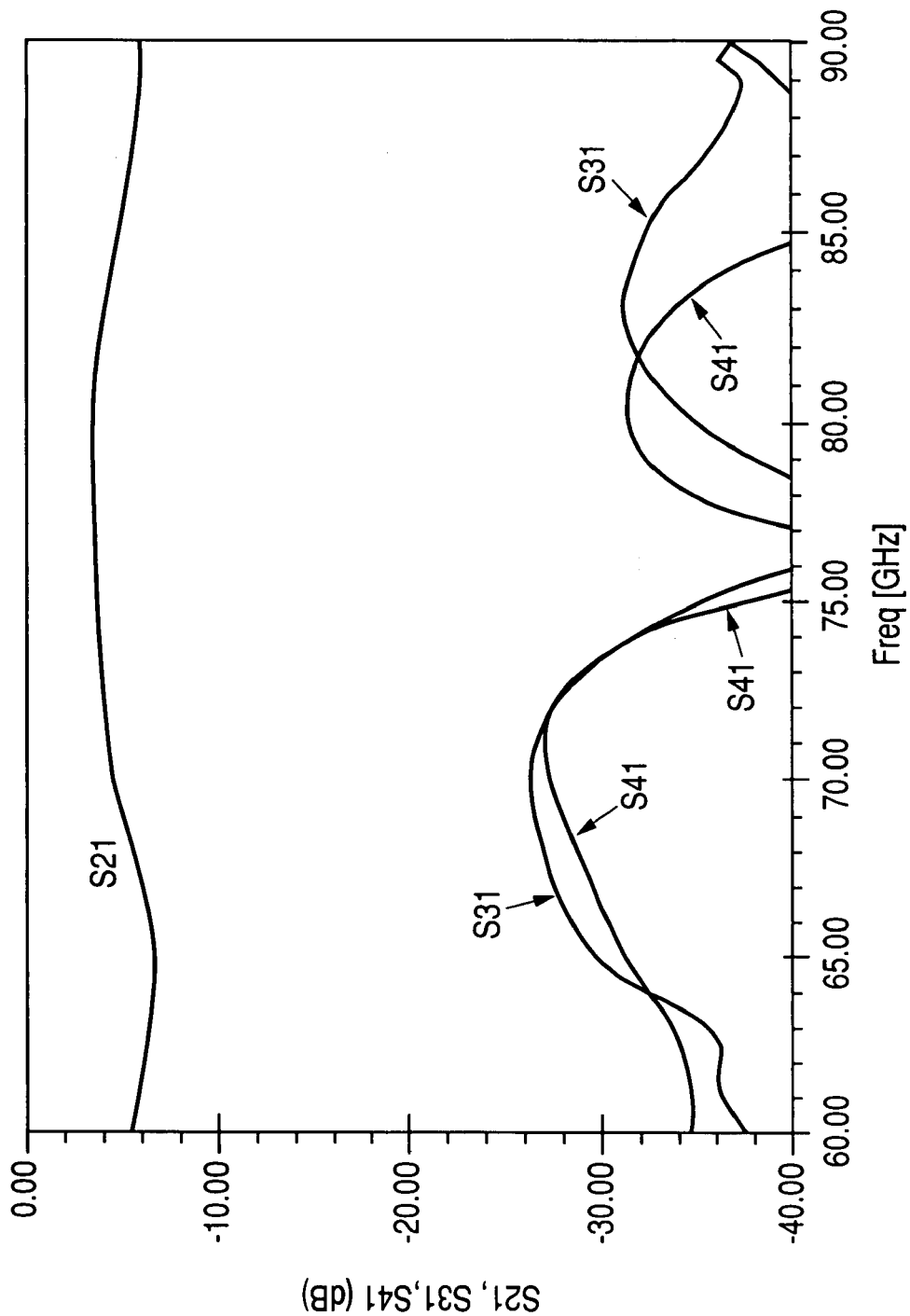
FIG. 8 is a graph showing a result of simulation on isolation characteristics of the high frequency circuit board according to the Second Embodiment.
Figure 9:
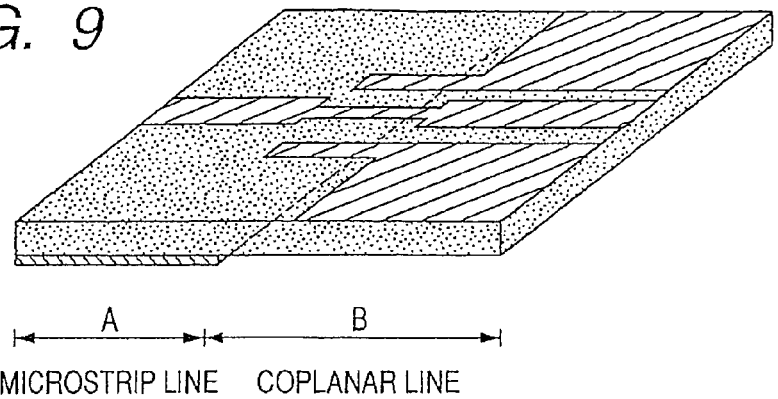
FIG. 9 shows a conventional high frequency circuit board.
Figure 10:
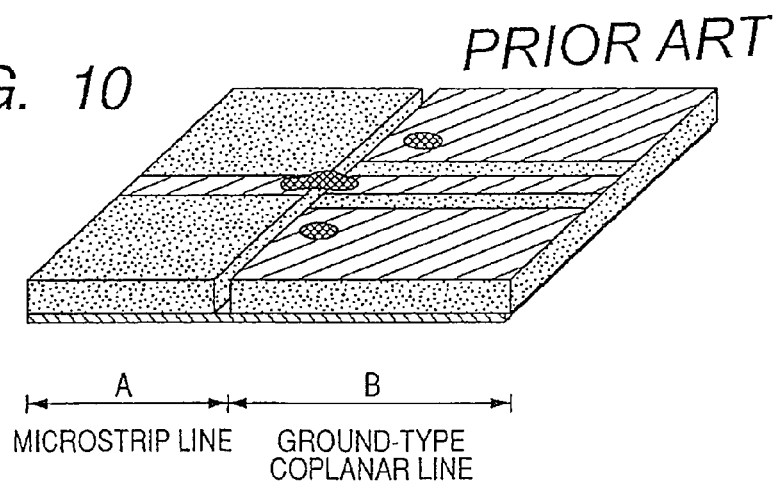
FIG. 10 shows a conventional high frequency circuit board.
Figure 11:
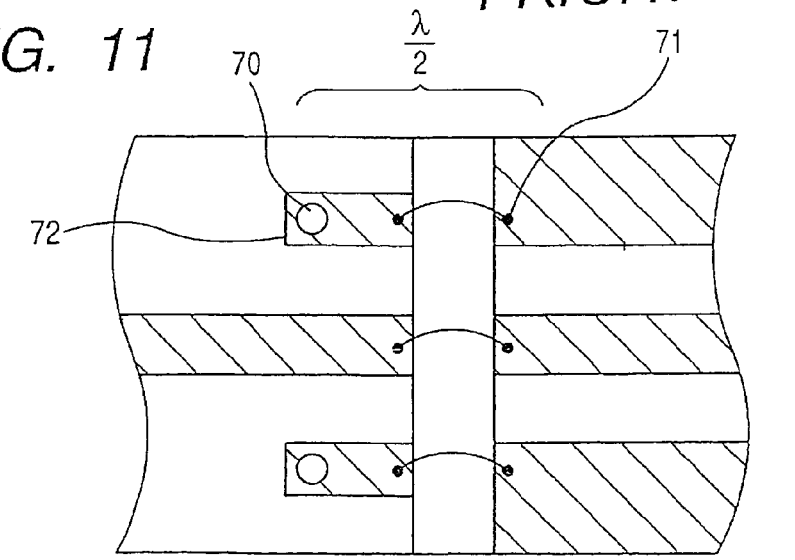
FIG. 11 is a high frequency circuit board which is achieved from FIG. 9 and FIG. 10.

FIG. 8 shows a result obtained by a simulation on transmission characteristic in the case where the frequency of a signal inputted through the port 1 of the high frequency circuit board according to the Second Embodiment is changed.

These characteristics are: the transmission characteristic S21 from the port 1 to the port 2, the transmission characteristic S31 from the port 1 to the port 3, and the transmission characteristic S41 from the port 1 to the port 4. The transmission characteristic S31 is −40 dB or less in a bandwidth from 76 GHz to 78.5 GHz, and the transmission characteristic S41 is −40 dB or less in a bandwidth from 75.5 GHz to 77 GHz. Both the transmission characteristic S31 and the transmission characteristic S41 are −30 dB or less in a bandwidth of 74

GHz or more, Meanwhile, the transmission characteristic S21 is approx. −4 to −7 dB from 60 GHz to 90 GHz, showing favorable values. As described above, it is found that the high frequency circuit board in the Second Embodiment has good isolation characteristics between the ports because of suppression effect of generating a parallel plate mode due to the imaginary ground.

What is claimed is:

1. A high frequency circuit board comprising:
    a microstrip line including a dielectric region, a ground conductor that is formed in a planar shape on a bottom surface of the dielectric region, a first signal strip conductor that is linear shaped and formed on a top surface of the dielectric region; and
    a coplanar line connected to the microstrip line for mounting a semiconductor device connected to the coplanar line, the coplanar line including: the dielectric region, a second signal strip conductor that is linear shaped and formed on a top surface of the dielectric region and connected to the first signal strip conductor, a pair of first ground strip conductors that are formed on the bottom surface of the dielectric region and not below the second signal strip conductor, and that are formed in regions that correspond to both sides of the second signal strip conductor in such a manner that they continue from the ground conductor, and second ground strip conductors that are formed on each side of the second signal strip conductor on the top surface of the dielectric region and are connected to end portions of the pair of the first ground strip conductors on the bottom surface.

2. The high frequency circuit board according to claim 1, wherein the semiconductor device is a millimeter-wave semiconductor device.

3. The high frequency circuit board according to claim 1, wherein the first signal strip conductor and the second signal strip conductor are electrically connected each other by a wire.

4. The high frequency circuit board according to claim 1, wherein the first signal strip conductor and the second signal strip conductor are formed as a single integrated member in that both of the signal strip conductors are connected electrically to each other.

5. The high frequency circuit board according to claim 1, wherein the second ground strip conductor is connected to a ground layer of the semiconductor device via a wire, and line lengths of the first ground strip conductor and the second ground strip conductor are set such that a connecting point between the wire and the ground layer is short circuited at a certain frequency.

6. The high frequency circuit board according to claim 5, wherein the first ground strip conductor is shaped such that the first ground strip conductor has a width perpendicular to a length-wise direction of the first ground strip conductor, the width gradually increasing as the first ground strip conductor travels in the direction toward the semiconductor device.

7. The high frequency circuit board according to claim 6, wherein the shape is a fan shape at least in an end portion region.

8. The high frequency circuit board according to claim 5, wherein the first ground strip conductor is shaped such that the first ground strip conductor has a width perpendicular to a length-wise direction of the first ground strip conductor, the width gradually decreasing as the first ground strip conductor travels in the direction toward the semiconductor device.

9. The high frequency circuit board according to claim 8, wherein the shape is a fan shape at least in an end portion region.

10. The high frequency circuit board according to claim 5, wherein the semiconductor device includes the ground layer on a surface or in the vicinity of a surface.

11. The high frequency circuit board according to claim 10, wherein the first ground strip conductor is shaped such that the first ground strip conductor has a width perpendicular to a length-wise direction of the first ground strip conductor, the width gradually decreasing as the first ground strip conductor travels in the direction toward the semiconductor device.

12. The high frequency circuit board according to claim 10, wherein the first ground strip conductor is shaped such that the first ground strip conductor has a width perpendicular to a length-wise direction of the first ground strip conductor, the width gradually increasing as the first ground strip conductor travels in the direction toward the semiconductor device.

* * * * *